US007063572B2

(12) United States Patent
Brandt et al.

(10) Patent No.: US 7,063,572 B2
(45) Date of Patent: Jun. 20, 2006

(54) MOTOR CONTROL CENTER INTERCONNECTION METHOD AND APPARATUS

(75) Inventors: David D. Brandt, Milwaukee, WI (US); Jie Shen, Shanghai (CN); David L. Jensen, Barneveld, WI (US); G. Erich Heberlein, Jr., Everett, WA (US); Chester Malkowski, Jr., Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 44 days.

(21) Appl. No.: 10/675,308

(22) Filed: Sep. 30, 2003

(65) Prior Publication Data

US 2005/0070166 A1 Mar. 31, 2005

(51) Int. Cl.
*H01R 25/00* (2006.01)
(52) U.S. Cl. .................... 439/638; 439/924.1
(58) Field of Classification Search ............... 439/638, 439/924.1, 374, 297
See application file for complete search history.

(56) References Cited

U.S. PATENT DOCUMENTS

| 4,236,189 | A | * | 11/1980 | Yosida ........................ 361/607 |
| 5,886,431 | A | * | 3/1999 | Rutigliano ................... 307/131 |
| 5,915,985 | A | * | 6/1999 | Fabian et al. ................ 439/248 |
| 6,447,340 | B1 | * | 9/2002 | Wu ............................. 439/660 |
| 6,607,394 | B1 | * | 8/2003 | Lindberg et al. ............ 439/326 |
| 2003/0051175 | A1 | * | 3/2003 | Heberlein et al. ........... 713/300 |
| 2004/0121645 | A1 | * | 6/2004 | Postrel ........................ 439/374 |
| 2005/0057320 | A1 | * | 3/2005 | Brandt et al. ............. 333/24 R |

\* cited by examiner

*Primary Examiner*—Hae Moon Hyeon
(74) *Attorney, Agent, or Firm*—Patrick S. Yoder; Alexander M. Gerasimow

(57) ABSTRACT

In one embodiment, the components within each respective unit of the MCC are connected powered by a connector assembly that is directly engaged to secondary power and network data conductors disposed of within the enclosure. The connector assembly, if so desired, will maintain connection even upon disengagement of the unit from the main power supply. This service position can be employed to provide a safe environment for diagnostic testing and repair of the unit. In another embodiment, the secondary power and network data conductors may by carried over an open rail system. This embodiment provides a convenient means of quickly and easily engaging the secondary power and network data conductors to the unit. Another embodiment provides a method for placing the unit into a service position.

50 Claims, 9 Drawing Sheets

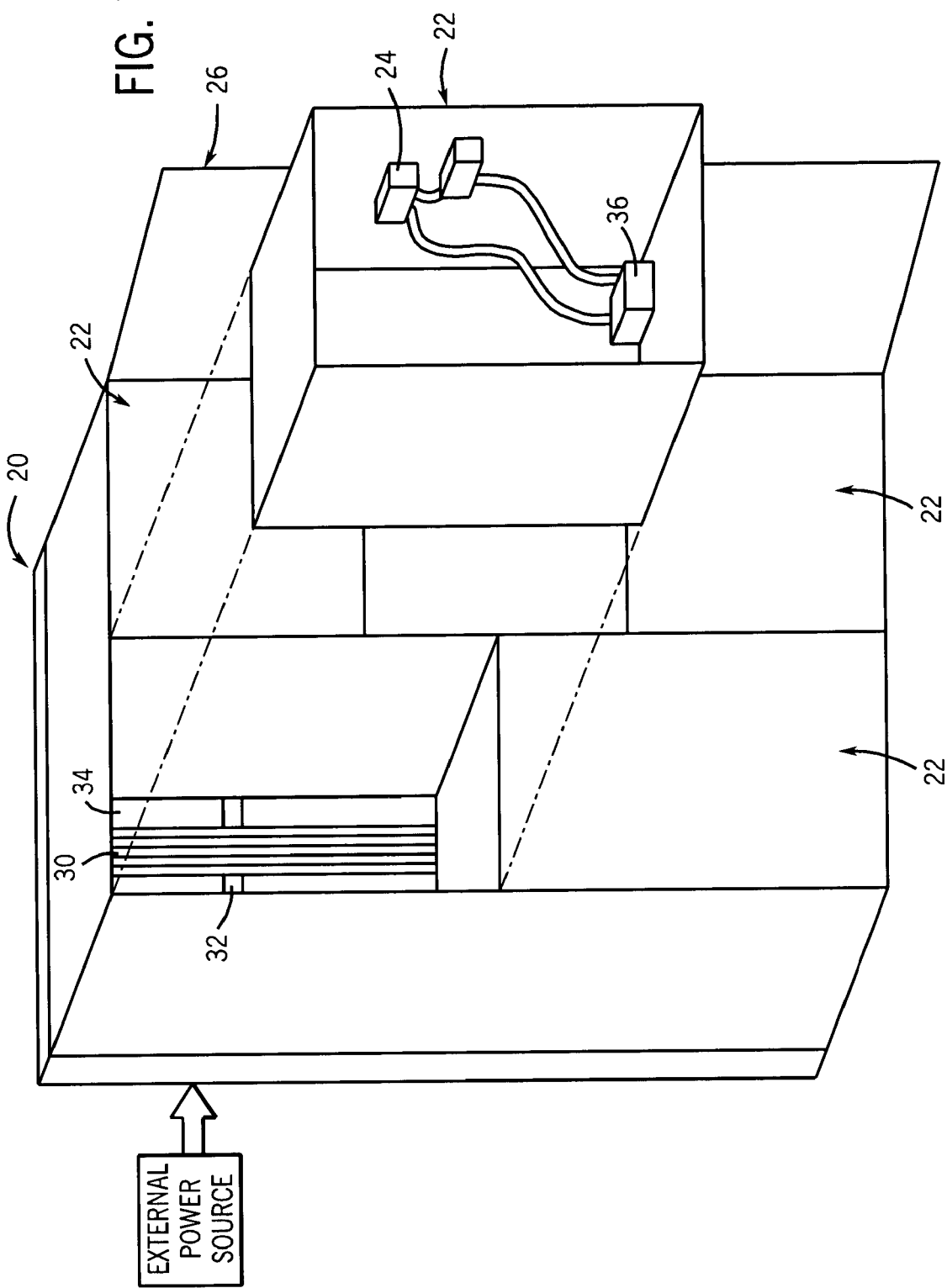

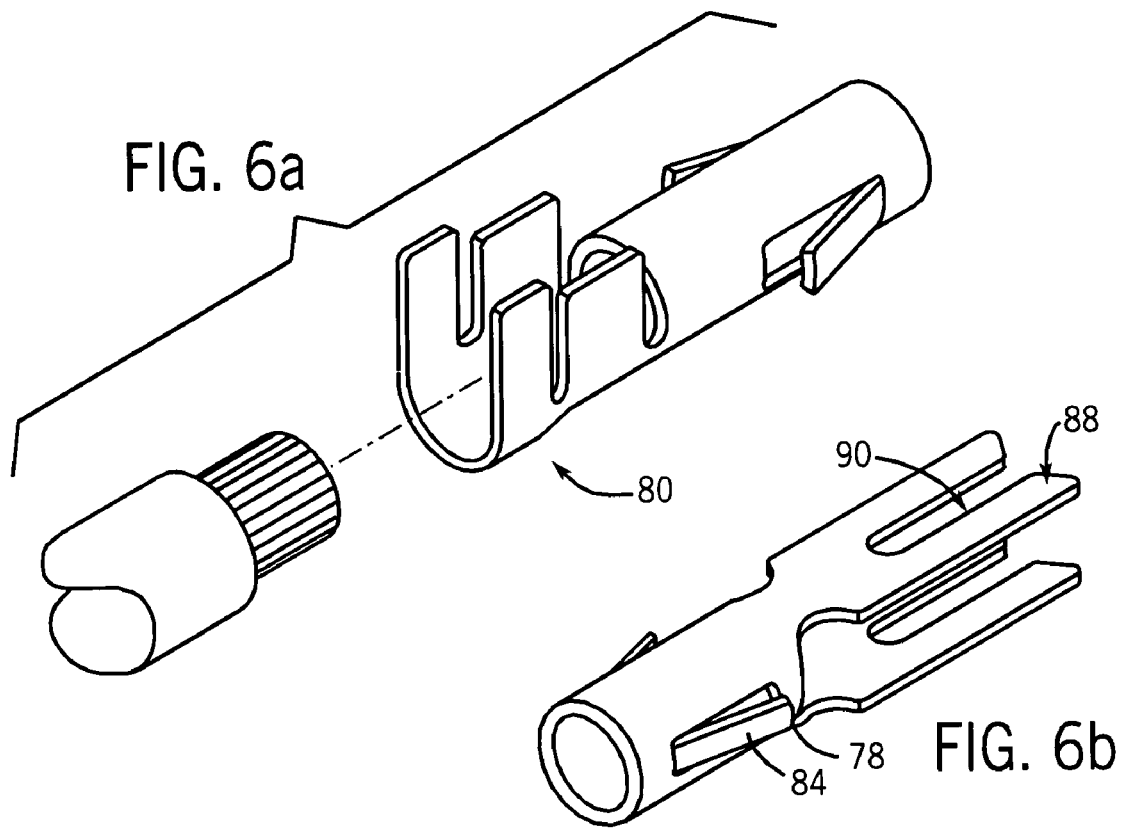
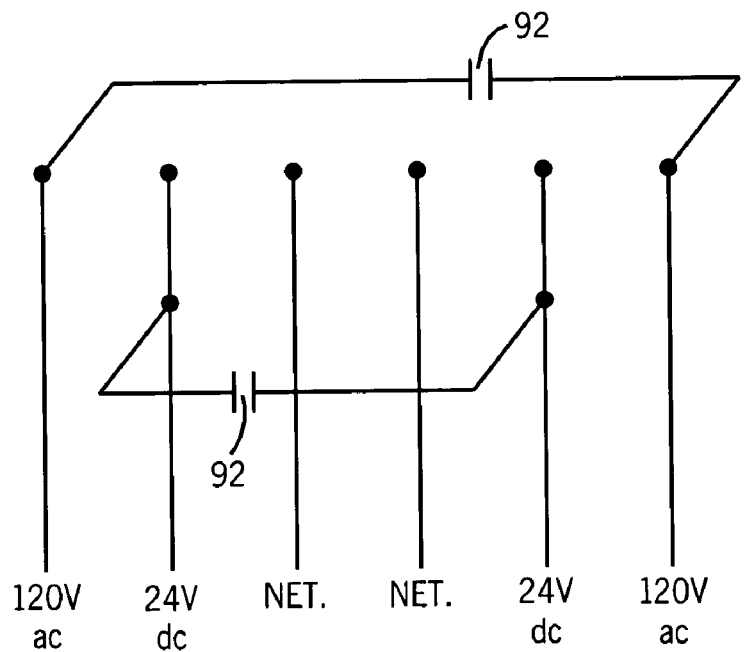
FIG. 7a

MOTOR CONTROL CENTER INTERCONNECTION METHOD AND APPARATUS

FIELD OF THE INVENTION

The present technique relates generally to the field of electrical control components, such as those found in motor control centers. Specifically, the invention relates to techniques for interconnecting such components to power and data networks.

BACKGROUND OF THE INVENTION

Power and data distribution systems employed in large commercial and industrial operations can be complex and widely divergent in design and operations. Motor control centers (MCCs), for example, are used in these operations to manage both application of electrical power as well as data communication to a variety of loads. Within the MCC are disposed a variety of components or devices used in the operation and control of the loads, such loads typically include various machines or motors. Typically, the MCC is connected to a main power line that feeds 3-phase ac power, such as 208 to 690 Volt ac power, into the MCC. The MCC then manages and distributes this power to various components within the assembly for operation. Exemplary devices contained within the MCC are motor starters, overload relays, and circuit breakers. These devices are then affixed within various "units" within the MCC. Each unit can be assigned a specific task and each unit may also contain devices that correspond to that task. For example, each unit may be assigned various remote control and monitoring operations.

Many of the components within the units, however, run at different electrical levels than provided by the main power lines, i.e. secondary power, typically lower voltage ac, single phase ac or even dc power. Moreover, devices or components within individual units may require a voltage level different than other components. Accordingly, the main power may be split off or transformed down to lower voltage levels as appropriate to the given component, or, alternatively, a completely separate supply source may be provided. For example, one phase of incoming 3-phase power may be used to provide single phase ac power, or a separate lower ac or dc voltage supply may be employed. Subsequently, this secondary power may be distributed to the various components. Additionally, data signals transmitted between the components or from external networks to and from the MCC may also require interconnection. Typically, the transmission of the secondary power and network data is accomplished via a medley of network and power cables.

During the course of operations, components within the MCC may be changed, added or warrant replacement for any number of reasons. In conventional systems, the unit is removed from the MCC to provide a technician access to the components therein. Moreover, the unit is removed prior to servicing so as to positively ensure interruption of the main power supply. Such removal typically is accomplished by completely disengaging the unit from the MCC. Both main and secondary power, as well as data signals, are then no longer transmitted between the MCC and the removed unit or its components. This creates a number of concerns for the technician. Many MCCs or housed components of the MCCs are electrically interconnected in a "daisy chain" manner. Accordingly, removal of one unit within the MCC may bring the entire MCC or any downstream devices off-line. Additionally, problems with components housed within the unit become more difficult for the technician to diagnose because many of the components within the unit become inoperative on removal. The unit would be easier to diagnose if, for example, the main power was disconnected while the distributed secondary power and network data remained coupled. Moreover, problems occurring in the field may be difficult to replicate and diagnose in a separate laboratory environment. That is, the units and components are more reliably tested in their application environment, while main power is disconnected.

There is a need, therefore, for an improved technique for interconnecting components in an electrical system such as MCCs and the like. There is, in particular, a present need for an easily and directly engageable and disengageable connection (i.e. not hard-wired) between the component assembly and the secondary power and network data conductors which is capable of maintaining engagement even when main power is disconnected.

SUMMARY OF THE INVENTION

The present technique provides a connection technique designed to respond to these needs. The technique may be employed in a wide range of systems, particularly in systems in which a number of electrical components are coupled to power and data conductors for remote control and monitoring operations. The technique is particularly well suited to MCCs and similar panel-mounted systems or rack-mounted systems in which both main power and secondary power conductors are employed for feeding power and command signals to components and for retrieving feedback signals via data conductors.

In one embodiment, the components within each respective unit of the MCC are linked to a connector assembly that is directly engaged to the secondary power and network data conductors. The connector assembly, in a service position, will maintain connection even upon disengagement of the unit from the main power supply. This service position can be employed to provide diagnostic testing and repair of the unit or for installation, replacement or repair of components supported within the unit.

In another embodiment, the secondary power and network data conductors may be carried over an at least partially open rail system. This embodiment provides a convenient means of quickly and easily engaging and disengaging the secondary power and network data conductors to the unit.

In yet another embodiment, a method for placing the unit into a service position is provided.

BRIEF DESCRIPTION OF THE DRAWINGS

The foregoing and other advantages and features of the technique will become apparent upon reading the following detailed description and upon reference to the drawings in which:

FIG. 1 is a perspective view of an exemplary system, in the form of a Motor Control Center (MCC), in which a component assembly is shown as being removed from the MCC housing;

FIG. 6a is a perspective view of an exemplary cable socket assembly;

FIG. 6b is a perspective view of an exemplary rail socket assembly;

FIG. 7a is an electrical schematic of exemplary power and data configurations which may be conducted over the rail system wherein capacitors are inserted across the power conductors to reduce perturbations to data signals;

DETAILED DESCRIPTION OF SPECIFIC EMBODIMENTS

Figure 2A:
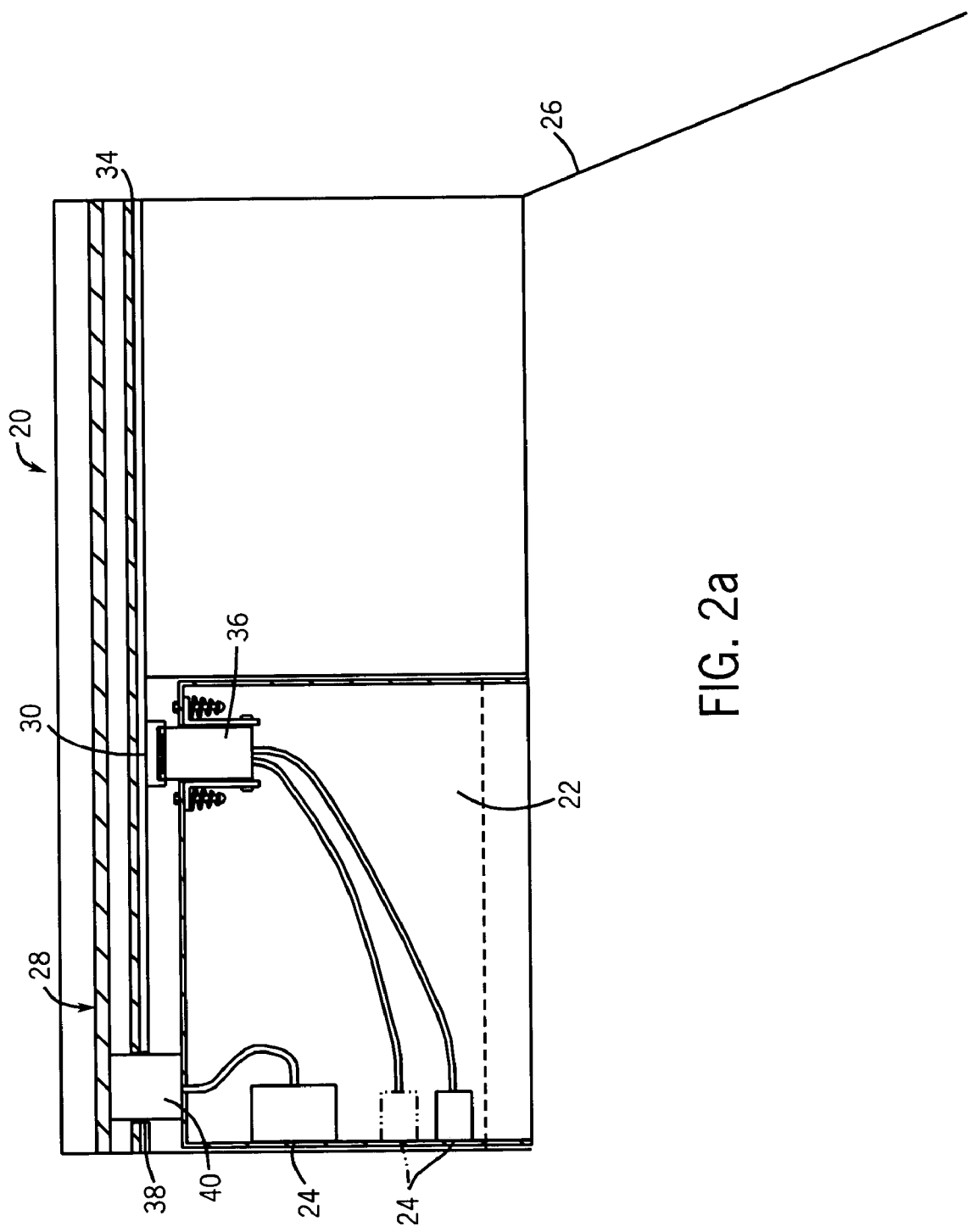
FIG. 2a is a plan view of the MCC in FIG. 1 in which the top panel is removed and the component assembly is in the engaged position such that the assembly receives both main power and secondary power, as well as data signals.

A variety of types of electrical enclosures may benefit from the present technique. For example motor control centers, automation controls, electrical distribution centers could all employ the present technique, as well as any suitable panel or rack-mounted systems. For the purposes of explanation, however, the present technique will be described with reference to a motor control center (MCC).

Beginning with FIG. 1, an exemplary MCC 20 generally includes a large metal enclosure in which are positioned a collection of removable units 22, each unit 22 containing an assembly of components 24. The components 24 are supported within the unit 22 via any number of known methods, typically via screwed or snap-in engagement, thereby providing mechanical and electrical connection to the system. Exemplary components 24 in an MCC 20 could be, relays, motor starters, programmable logic controllers (PLC), or any one of a number of devices used to manage the desired operation. These components 24 are generally interconnected as they send and receive various signals to one another and to external control devices, loads, actuators, sensors, and so forth. The MCC 20 has one or more doors 26 that can be closed to protect and isolate the components 24 of the MCC 20 while in operation and opened to access the components when necessary.

The exemplary MCC 20 receives main power from a main power bus 28 (shown in FIG. 2). This bus 28 generally carries 3-phase ac power, such as 208 to 690 Volt ac power, to the MCC 20. This power, however, is not necessarily what is required by the various components 24 within the units 22. To facilitate operation of the components 24, the control or secondary power is split from the main power or transformed down to a more acceptable secondary power level. Select components, for example, may operate on 120V single phase ac power and yet other components may operate on 24V dc power. Additionally, the components 24 may require communication of network data signals to and from various other components 24 disposed throughout the overall system (i.e. within other sections, other enclosures, other MCCs or at locations remote from the MCC). To facilitate the transmission of secondary power and network data, a component bus may be employed. In the present embodiment this bus is exemplified by an open rail assembly 30. The open rail assembly 30 is supported on a horizontal support member 32, which, in turn, is affixed to a rear support 34 of the MCC 20. In the illustrated embodiment, the support member 32 runs perpendicular to the open rail 30. However, in alternative embodiments, the support member 32 and rail 30 may be oriented in various positions with respect to each other.

While multiple levels and types of power are provided within the MCC and to the various components, it is often desirable to remove at least the three-phase, high voltage power during servicing of the system. Moreover, the present technique permits such removal of the main power from individual units while allowing secondary or control power, as well as data signals, to be applied to the components of a unit such as to allow for their testing, verification, calibration, troubleshooting, and so forth. In the illustrated embodiment, a connector assembly 36 facilitates this functionality. Furthermore, it is worth note that in certain instances it may be advantageous to disconnect the load from a particular MCC or bank of MCCs. Indeed, any number of permutations relating to transmission of power, secondary power and data in to and from the components, MCC and load are envisaged.

Within each unit 22, the connecter assembly 36 is configured to mate with the open rail 30. Specifics of the connector assembly 36 will be further clarified in subsequent paragraphs. As illustrated, the connector assembly 36 is fastened to the unit 22 and electrically coupled to the various components 24. The connector assembly 36 is positioned so as to allow the assembly 36 access to the rail 30 through an access side of the unit 22, such as the rear side. Once coupled to the open rail 30, various cable connections may be employed between the connector assembly 36 and the components 24 to facilitate distribution of secondary power and network data.

Figure 2B:
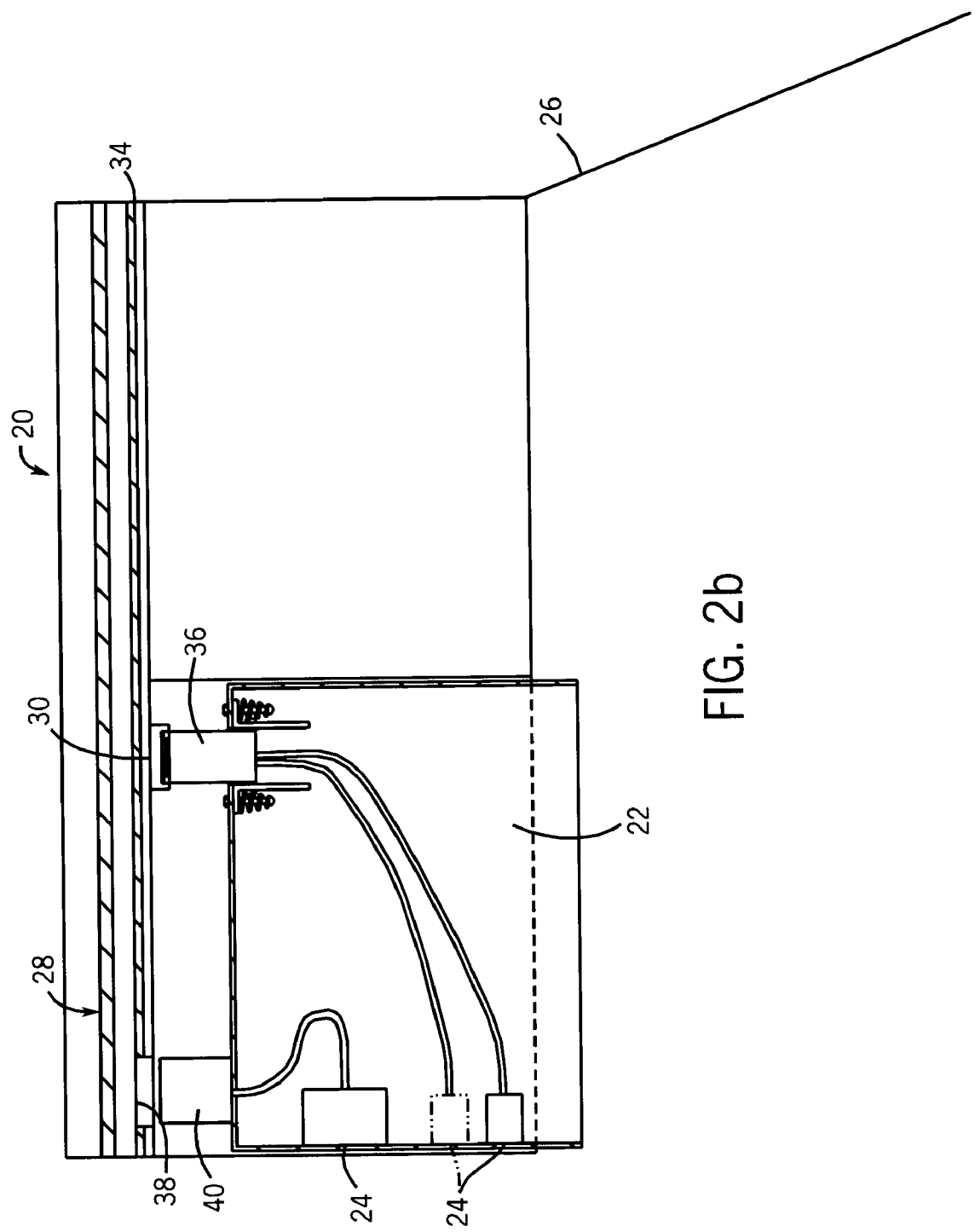
FIG. 2b is a plan view of the MCC in FIG. 1 in which the top panel is removed and the component assembly is disengaged from the main power but remains engaged with secondary power and data conductors.

FIGS. 2a and 2b illustrate the MCC 20 unit of FIG. 1 in plan view with the top panel removed. On the rear side of the support 34 is mounted the main power bus 28. Through the support 34 is an access port 38 aligned with a main power connector 40 that is attached to the rear of the unit 22. It should be noted that within the unit 22 there may be certain components 24 that require main power to operate (e.g. for distribution to loads). Accordingly, the main power connector 40 facilitates the electrical communication of main power to these components.

In FIG. 2a the unit 22 is shown in the engaged position. When in the engaged position, the main power connector 40 is connected to the main power bus 28, and the connector assembly 36 is connected to the open rail 30. In this position the unit 22 and its components are fully operational. As the unit 22 is extracted from the MCC 20, the unit 22 moves into an exemplary service position as depicted in FIG. 2b. In this service position the main power connector 40 is disconnected from the main power bus 28, while the connector assembly 36 remains connected to the open rail 30. This allows the technician to run diagnostic tests on certain components as they remain connected to secondary power, as well as receiving network data signals. Advantageously, the unit 22 or the MCC may comprise indicators, such as LEDs, mechanical devices or audio devices, which indicate the position (e.g. service position, maintenance position) of the unit 22 or MCC.

Figure 3A:
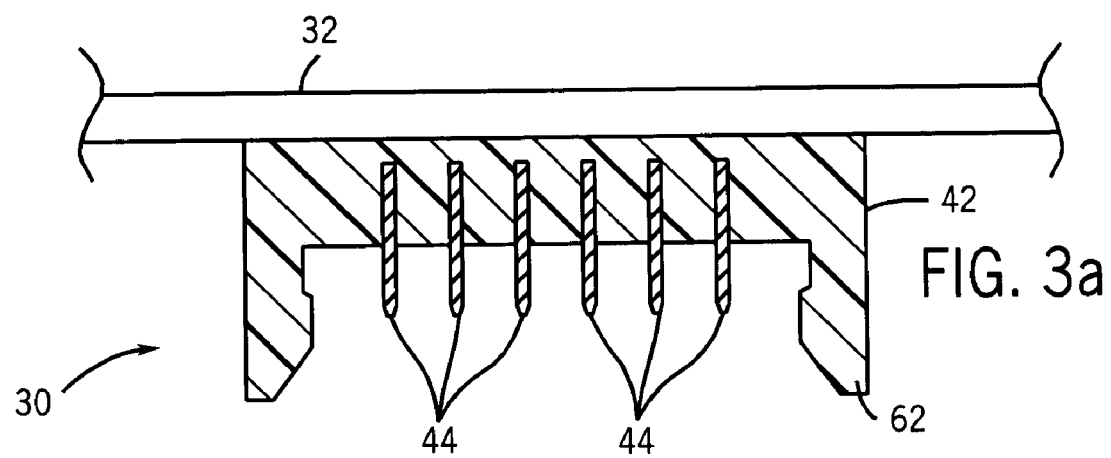
FIG. 3a is a cross section view of an exemplary open rail system disposed within the exemplary MCC.
Figure 3B:
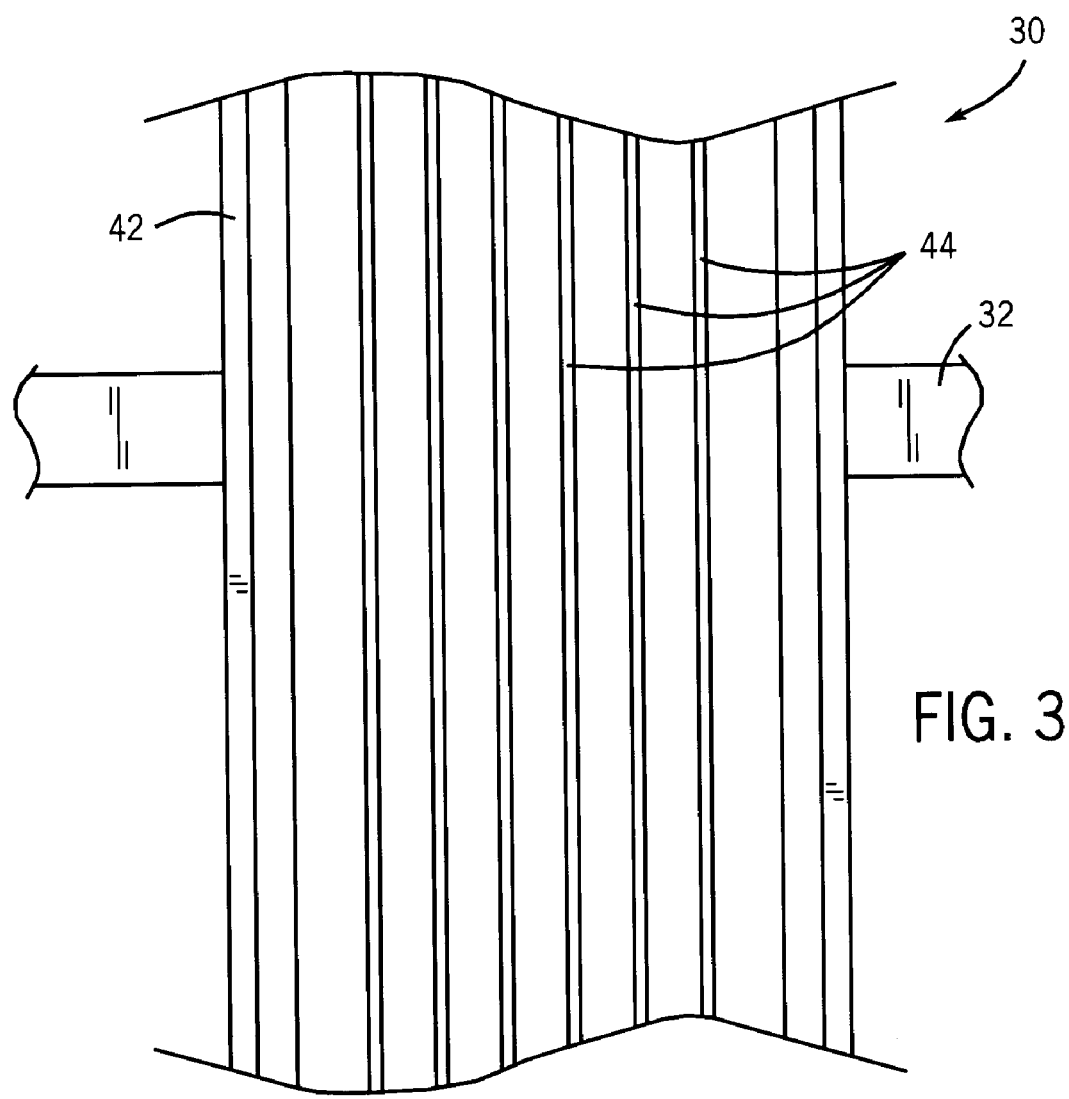
FIG. 3b is a front view of the exemplary open rail system for power and data distribution disposed within the exemplary MCC.
Figure 4:
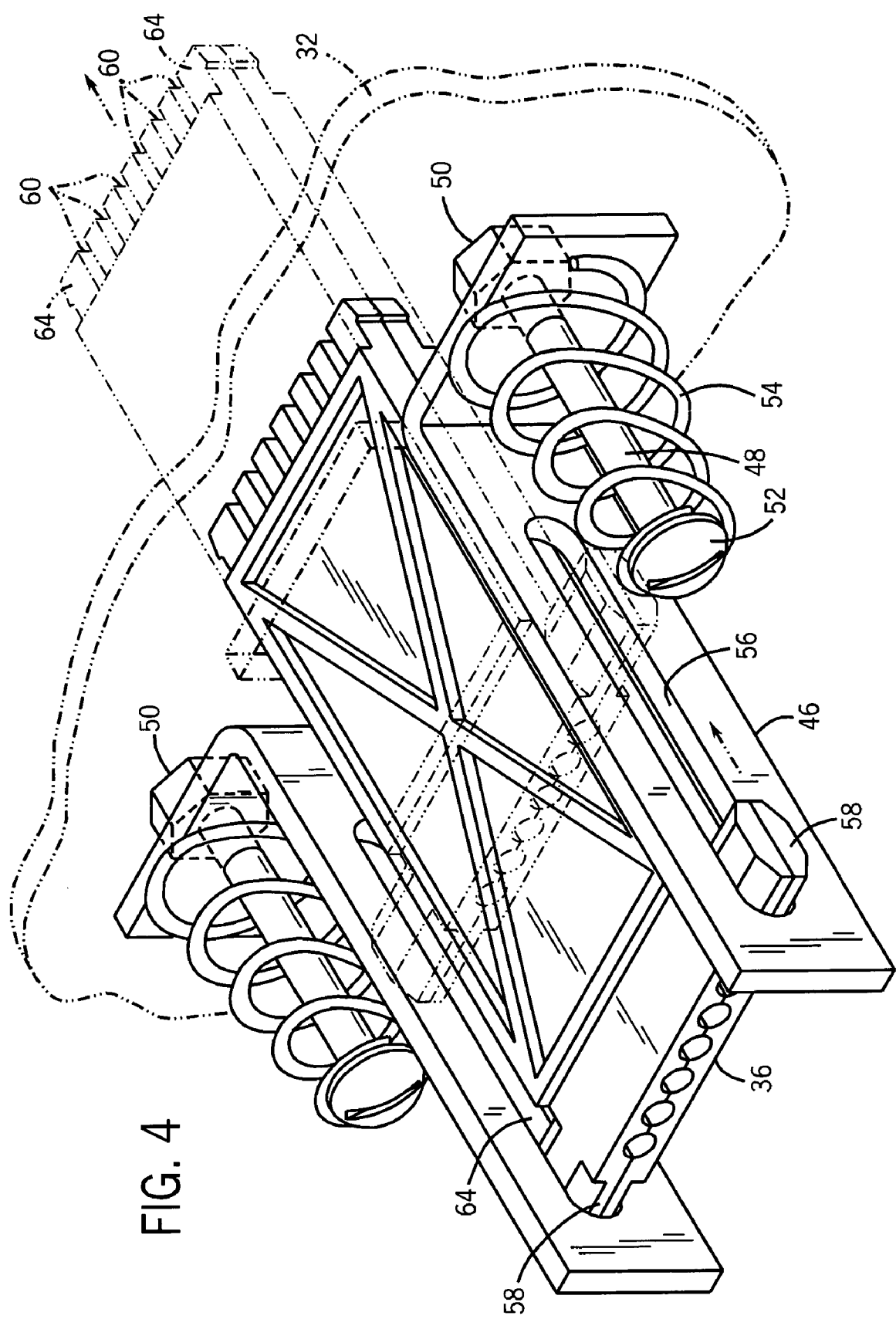
FIG. 4 is a perspective view of an exemplary connector assembly configured to engage the open rail system.

Turning next to FIGS. 3 and 4, these figures illustrate an exemplary technique for maintaining the connector assembly 36 in electrical contact with the open rail 30 while in the service position. Beginning with FIG. 3, the rail assembly 30 comprises of a rail housing 42 that supports a plurality of conductive rails 44. The rail housing 42 is fabricated from an electrically insulative material so as to prevent an electrical short between the conductive rails 44. The rails 44 are embedded into the rail housing 42 and, as such, supported by the housing 42. The rails 44 are fabricated from a conductive material, preferably a copper or copper alloy.

The connector assembly 36, as best shown in FIG. 4, facilitates the connection between the unit 22 and the rails 44. The exemplary connector assembly 36 comprises a multi-piece structure that is slidably mounted to the unit 22. A pair of L-shaped brackets 46 are mounted to the interior side of the back panel of the unit 22 via a set of mounting bolts 48. In the illustrated embodiment, the mounting bolts 48 pass through the brackets 46 and the back panel of the unit 22 and, subsequently, are fastened by corresponding mounting nuts 50. Other structures and arrangements may, of course, be employed. Inserted between the heads 52 of the mounting bolts 48 and the brackets 46 are compression springs 54. The compression springs 54 allow for minor adjustments in the position of the connector assembly 36 and bias it to a center position once it is disengaged from the rails. Such positionability also aids the user in aligning the connector assembly 36 with the rails 44.

Within the brackets 46 are a set of slots 56. The slots 56 are correspondingly mated with a set of tabs 58 located on the connector assembly 36. The tabs 58 are sized so as to allow free movement of the tabs 58 in a direction parallel to the slots 56. During installation of the unit 22, the unit 22 is pushed into abutment with a unit stop (not shown) located in the rear of the MCC 20. At this point, the unit is connected to the main power bus 28 through the main power connector 40 (see FIG. 2a). When the connector assembly 36 loosely abuts the open rail 30, the relatively free nature of the tabs 58 in the bracket slots 56 allows the connector assembly 36 to remain in a stationary location relative to the moving unit 22. Because the slots 56 have a fixed length, the free travel of the connector assembly 36 will terminate once this distance has been traversed. Subsequently, the slot 56 perimeters contact with the tab 58 of the connector assembly 36 on each side and drive the assembly towards the open rail 30. As the connector assembly 36 travels toward the rails 44, a set of engagement grooves 60 mate with the rails 44 (see broken lines in FIG. 4). Minor misalignments between the engagement grooves 60 and rails 44 are corrected by the flexible nature of the compression springs 54 and the angled interior of the locks 62 and the keys 64. The connector assembly 36 is then secured to the rail housing 42 by a lock and key system. A set of flexible locks 62 (see FIG. 5), located on the rail housing 42, outwardly deform to accept a pair keys 64 (see FIG. 4) located on the outer edges of the connector assembly 36. The lock and key system prevents unintended disengagement of the connector assembly 36 from the rail housing 42. While engaged, the unit 22 receives both main power and secondary power, as well as network data.

If maintenance or replacement of a component 24 is warranted, the unit 22 can be disengaged from the MCC 20 in a standard manner. This is accomplished by extracting the unit 22 from the MCC 20 in a direction away from the open rail 30. As the unit 22 is extracted, the main power connector 40 disengages from the main power bus 28. In contrast, the slideable nature of the connector assembly 36 allows the connector assembly 36 to remain engaged to the rail housing 42. In this service position, the unit 22 is disengaged from main power yet still receives secondary power and network data. The service position allows the technician to perform diagnostics or other service on various components 24 in the system. Moreover, certain of the components 24 may remain active and, as such, can continue operating while service is being performed. Continuity of operation reduces downtime and improves the efficiency of the operation. Moreover, operability of the components can be verified without application of main power to the loads or to the components themselves.

As the unit 22 is further extracted from the MCC 20, the range of motion of the tabs 58 and connector assembly 36 is limited by the perimeter of the slots 56 in the brackets 46. At this point, the bracket slots 56 pull the connector assembly 36 away from the open rail 30. The force of the bracket slots 56 on the connector assembly 36 is sufficient to elastically deform the locks 62 and release the keys 64 from the rail housing 42. Once released, the engagement grooves 60 are pulled out of contact from the rails 44. At this point, the secondary power and network data signals are no longer received by the unit 22 or its components. In the illustrated embodiment, the connector assembly is designed to engage and disengage with each of the open rails simultaneously. However, in an alternate embodiment, the dimensions of the engagement grooves 60 and corresponding rails 44 may be altered so as to allow staggered engagement and disengagement of the unit 22 from specific rails 44, such as for first mating and last breaking of a ground connection or sequencing of power supplies. Even upon full disengagement of the unit 22, the rail system can still feed the remaining units 22 of the MCC 20. Accordingly, the MCC 20 can remain online and functioning.

Figure 5:
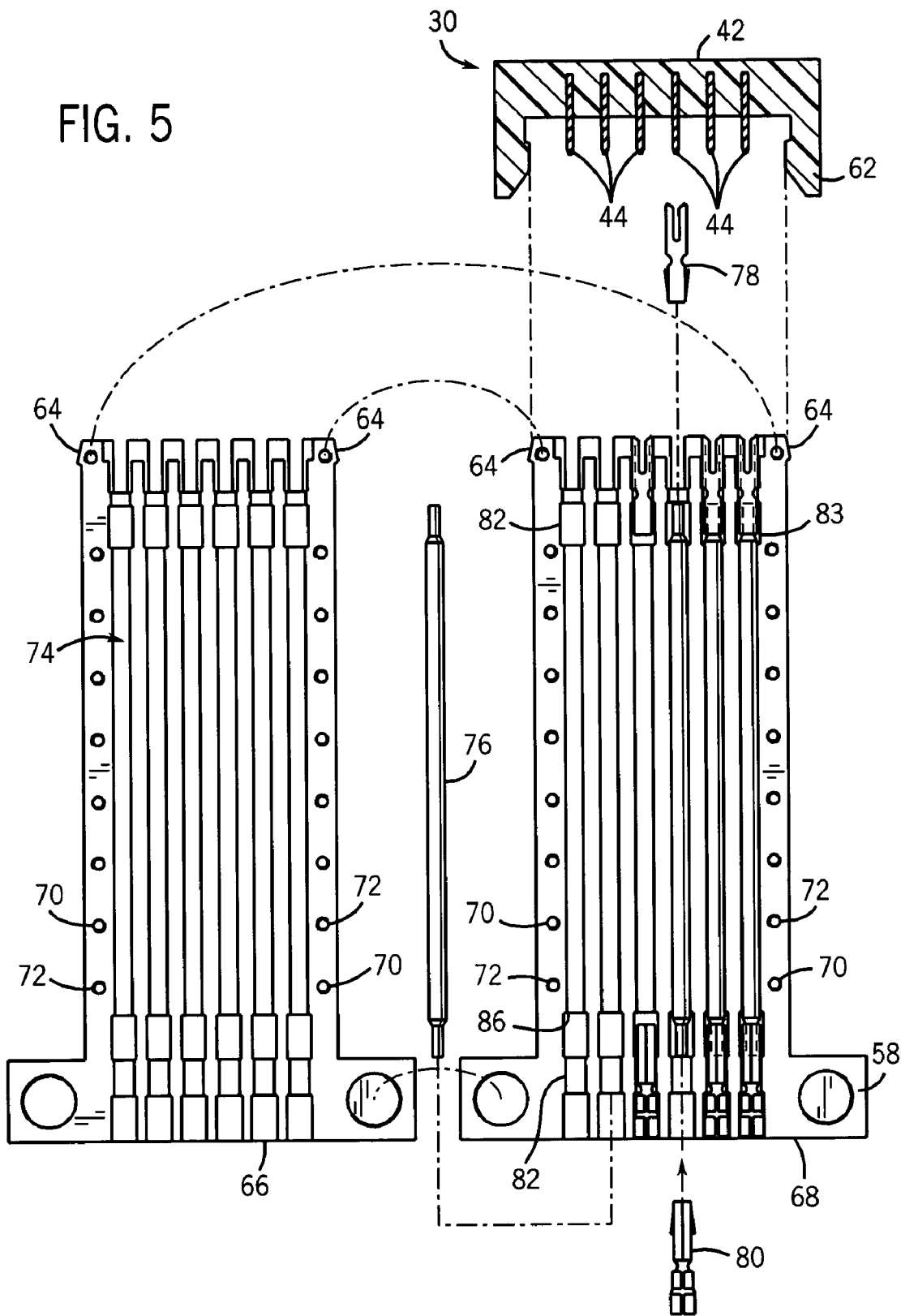
FIG. 5 is an exploded view of the exemplary connector assembly prior to engagement with the open rail system of FIGS. 3a and 3b.

FIG. 5 shows an exploded view of an exemplary connector assembly 36. The connector assembly 36 is fabricated from an insulative material, typically plastic. The connector assembly 36 comprises an upper piece 66 designed to lockingly mate with a lower piece 68. The connector assembly is fashioned together by corresponding pins 70 and holes 72 located along the outer edges of the respective pieces 66 and 68. Close tolerances between the holes 72 and pins 70 create a friction fit between the two pieces. Disposed within both the upper and lower pieces 66 and 68 are a series of channels 74. At the ends of each channel are barbell shaped cavities 82. Each channel 74 is designed to secure various conductors necessary to maintain electrical contact between the two ends of the connector assembly 36. The channels 74 are configured to secure conductive rods 76, while the cavities 82 are designed to hold various sockets 78 and 80. The conductive rod 76 is tapered so as to provide a male connection that may be inserted into female ends of rail socket 78 and cable socket 80, respectively. Again the diameter of the taper and the socket opening are maintained in close tolerance as to create a friction fit between the two members.

Referring also to FIGS. 6a and 6b, these figures illustrate perspective views of the cable socket 80 and the rail socket 78, respectively. On each socket 78 and 80 are a set of elastic tabs 84 that are biased in the outward direction. When inserted into the cavities 82, the free ends of the tabs 84 abut against the central and reduced diameter portion of the barbell shaped cavities 82. This abutment prevents the socket 78 or 80 from moving in an outward manner respective to the connector assembly 36. Moreover, the inner portion of the barbell shaped aperture 82 creates a shoulder 86 that also helps maintain the sockets 80 and 78 in a fixed position.

The electrical connection between the rail 44 and the connector assembly 36 occurs when the rail socket 78 comes into contact with its respective rail 44. As the connector assembly is driven towards the rails 44, a guide notch 88 directs the rail 44 into a forked groove 90 on the rail socket 78. By varying the length of the rail 44 or of the socket 78, or a combination thereof, engagement of each socket 78 with its respective rail can occur at staggered positions. Thus, a multiple number of service positions can be maintained. For example, a subset service position could be a position such that the ac power is disconnected while, again for example, the dc, or more generally, control power and network data signals remain engaged. Varying the length of the pins can therefore aid in sequencing connection and disconnection of earth ground, secondary power supplies and network signals during transitions between different service positions.

Figure 7B:
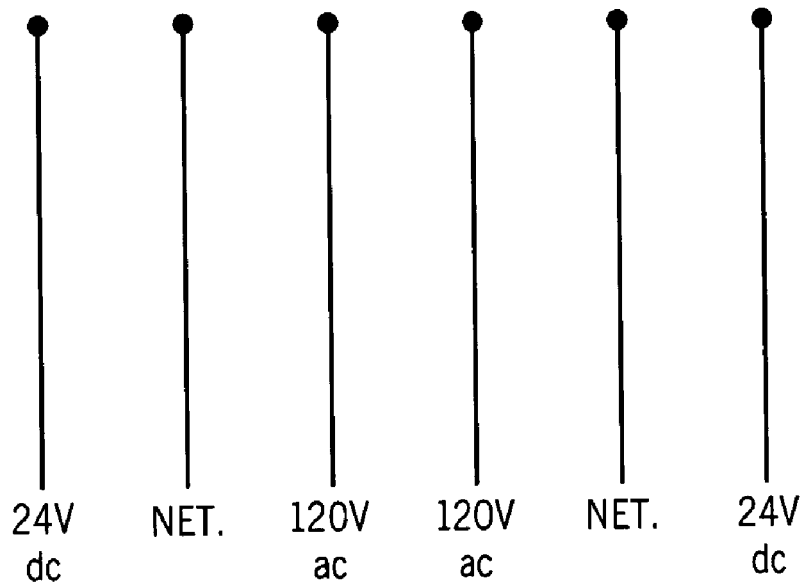
FIG. 7b is an electrical schematic of another exemplary power and data configuration conducted over the rail system.
Figure 7C:
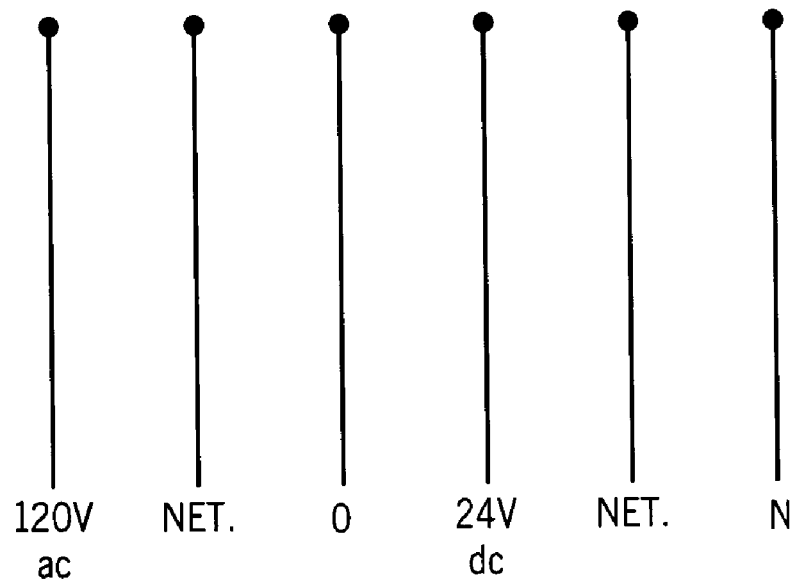
FIG. 7c is an electrical schematic of yet another exemplary power and data configuration conducted over the rail system.

FIGS. 7a, 7b, and 7c depict exemplary power and data signals configurations that may be carried over the rails 44. Although a six-rail configuration is shown in the exemplary figures, it is to be noted that any number of configurations of data and power signal rails can employ the present technique. Similarly, different power and data signals may be applied to the various rails. By way of example only, the first figure, FIG. 7a, illustrates the outer most rails 44 as carrying the 120V ac power, the central rails 44 as carrying the 24V dc power and the innermost rails 44 as carrying the network data signals. Engagement and disengagement of the connector assembly 36 from the power rails, and changes in current or frequency of the power through such rails can induce electrical perturbations in the data rails. In order to reduce the impact of the change in the electrical system, filtering capacitors 92 are coupled across the power lines. The capacitors 92 may be placed over both sets of power conductors or only over a single set if so desired. In certain applications, such capacitors may not be needed, and may be eliminated.

FIG. 7b illustrates another electrical configuration for the rails 44. In this configuration, the exemplary dc power is conducted over the outermost rails, the data signals over the innermost rails, and the ac power over the intermediate rails. By running the power conductors along rails juxtaposed to the data conductor rails, the power rails may at least partially shield the data rails from stray electromagnetic interference and crosstalk. FIG. 7c illustrates yet another electrical configuration for the rails 44, in which ac power is applied to the outermost rails, dc power is applied to the innermost rails, and data signals are applied to the intermediate rails.

It should be noted that, the electrical properties of the rails and system can be altered by varying the distances between the rails 44. By varying the space between the data conductors or by varying the space between the first and second power conductors with respect to the data conductors, properties such as capacitance, inductance, velocity of propagation, crosstalk, shielding or characteristic impedance may be affected.

Figure 8:
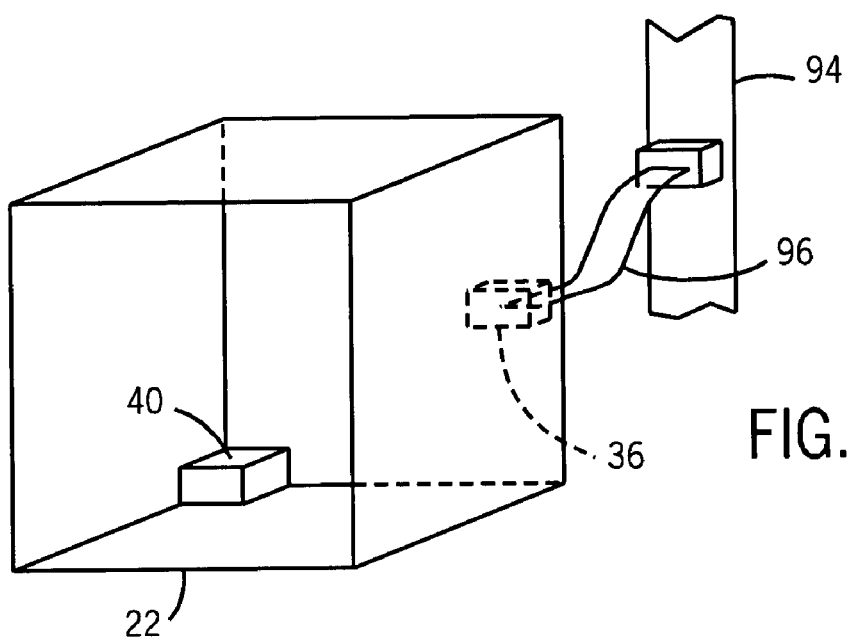
FIG. 8 is a perspective view of another exemplary component assembly embodiment capable of disengaging from a first power source while remaining engaged to a secondary power source and a data network.
Figure 9A:
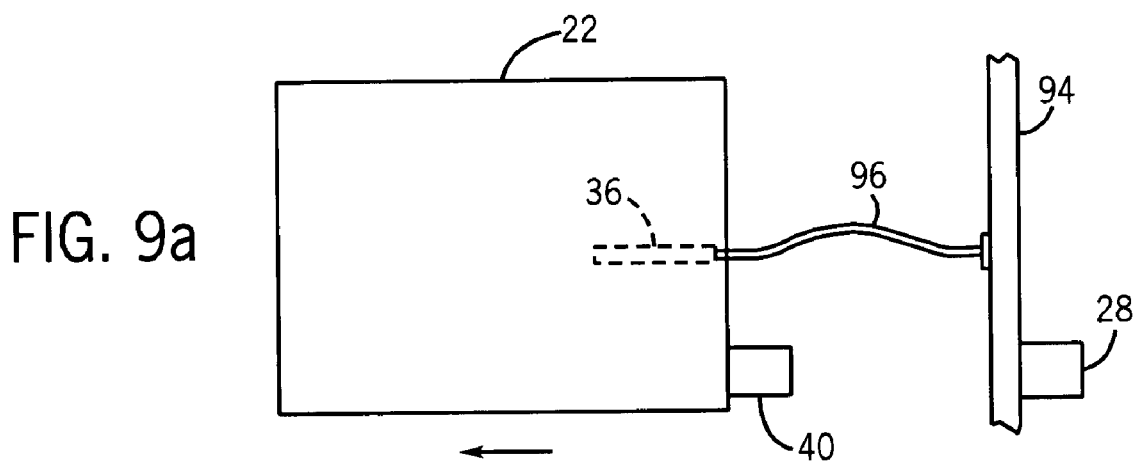
FIG. 9a is a side view of the embodiment in FIG. 8 with the first power source disengaged while the secondary power source and data network remain engaged.
Figure 9B:
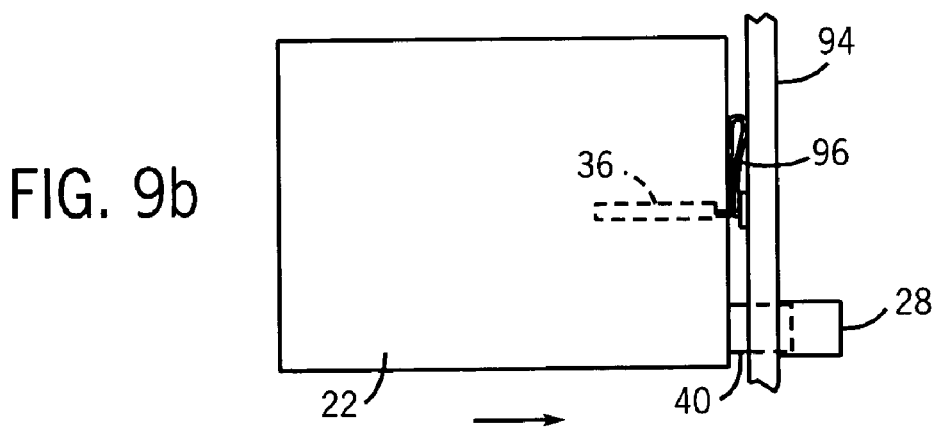
FIG. 9b is a side view of the embodiment in FIG. 8 with the first power source engaged along with the secondary power source and data network.

FIG. 8 illustrates a second exemplary technique for placing the unit 22 into a service position. Again the unit 22 is partially extracted from the MCC 20. In this embodiment however, the open rail is replaced with a secondary bus 94. This secondary bus 94 can be configured to carry secondary power and network data signals. The main power connector 40 remains fixedly positioned within the unit 22 as previously described. The connector assembly 36 in this embodiment, however, comprises a cable 96 electrically coupled to the secondary bus 94. FIG. 9b illustrates that the cable 96, when the unit 22 is in the engaged position, is loose and without tension. As the unit 22 is extracted from the MCC 20, the tension in the cable 96 increases. FIG. 9a shows the unit 22 in the service position such that the main power connector 40 is disengaged while the secondary power bus 94 is engaged with the unit 22. After the slack in the cable 96 is expended further applied tension will pull the cable 96 out of the secondary bus 94. At this point the unit 22 will be fully disengaged from the MCC 20.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An electrical component system comprising:
   an enclosure;
   main power conductors disposed in the enclosure to convey power from a main source of power;
   secondary power conductors disposed in the enclosure to convey power from a secondary source of power;
   network data conductors disposed in the enclosure;
   a component assembly including a component support and at least one component mounted on the support, the component assembly being engageable in the enclosure;
   a main power connector disposed on the support and adapted to complete electrical connection between the component assembly and the main power conductors upon engagement of the component assembly into the enclosure; and
   a connector assembly disposed on the component support and adapted to be coupled to the component assembly, the connector assembly being further adapted to complete an electrical connection between the component assembly and the secondary power and network data conductors upon engagement of the component assembly in the enclosure.

2. The system of claim 1, wherein the component assembly is positionable in a service position in which the main power connector is electrically disconnected from the main power conductors, and wherein the connector assembly is configured to maintain electrical connection between the component and the secondary power and network data conductors in the service position of the component assembly.

3. The system of claim 2, wherein the component assembly is positionable in the service position by extracting the component assembly partially from the enclosure after engaging the component assembly in the enclosure.

4. The system of claim 1, wherein the connector assembly includes an engageable contact set for maintaining electrical connection with the secondary power and network data conductors.

5. The system of claim 4, wherein the contact set includes a connection to earth ground.

6. The system of claim 1, wherein the connector assembly includes at least one capacitor coupled across the power conductors to limit perturbations of signals through the data conductors.

7. The system of claim 1, wherein the secondary power and network data conductors are provided on an open rail structure supported within the enclosure.

8. The system of claim 7, wherein the data conductors are provided at an innermost cross sectional position on the rail structure and the power conductors are provided at flanking positions with respect to the network data conductors.

9. The system of claim 7, wherein the rail structure includes at least one capacitor coupled across the power conductors.

10. The system of claim 7, wherein the open rail structure includes first and second sets of power conductors providing different levels of power for components mounted on the component support.

11. The system of claim 10, wherein the different power levels include a level of ac power and a level of dc power.

12. The system of claim 10, wherein the rail structure includes at least one first capacitor coupled across the first set of power conductors and at least one second capacitor coupled across the second set of power conductors.

13. The system of claim 1, comprising a cable system disposed in the enclosure and including a connector configured to mate with the connector assembly to complete electrical connection between the component and the secondary power and network data conductors.

14. The system of claim 13, wherein the secondary power and network data conductors are disposed in the cable system.

15. The system of claim 14, wherein the connector is disposed on a portion of the enclosure against which the component support bears when engaged in the enclosure.

16. An electrical component system comprising:
an enclosure;
main power conductors disposed in the enclosure;
secondary power conductors disposed in the enclosure;
network data conductors disposed in the enclosure; and
a component assembly including a component support and at least one component mounted on the support, the component assembly being engageable in the enclosure;
wherein the component assembly is positionable in an operational position in which the component assembly is electrically connected to the main power conductors and to the secondary and network data conductors, respectively, and a service position in which the component assembly is electrically disconnected from the main power conductors but remains electrically connected to the secondary power and network data conductors to receive secondary power and network data.

17. The system of claim 16, wherein the component assembly is positionable in the service position by extracting the component assembly partially from the enclosure after fully engaging the component assembly in the enclosure.

18. The system of claim 16, wherein the component assembly is positionable in the service position by partial engagement of the component assembly in the enclosure.

19. The system of claim 16, comprising a set of main power connectors disposed on the support and adapted to complete electrical connection between the component and the main power conductors upon engagement of the component assembly into the enclosure.

20. The system of claim 19, comprising a connector assembly disposed on the component support and adapted to be coupled to the component and to the secondary and network data conductors.

21. The system of claim 20, wherein the connector assembly includes a sliding contact set for maintaining electrical connection with the secondary power and network data conductors.

22. The system of claim 20, wherein the connector assembly includes at least one capacitor coupled across the power conductors to limit perturbations of signals through the network data conductors.

23. The system of claim 16, wherein the secondary power and network data conductors are provided on an open rail structure supported within the enclosure.

24. The system of claim 23, wherein the network data conductors are provided at an innermost cross sectional position on the rail structure and the power conductors are provided at flanking positions with respect to the data conductors.

25. The system of claim 23, wherein the rail structure includes at least one capacitor coupled across the power conductors.

26. The system of claim 23, wherein the open rail structure includes first and second sets of power conductors providing different levels of power for components mounted on the component support.

27. The system of claim 26, wherein the different power levels include a level of ac power and a level of dc power.

28. The system of claim 27, wherein the rail structure includes at least one first capacitor coupled across the first set of power conductors and at least one second capacitor coupled across the second set of power conductors.

29. A motor control system, comprising:
an enclosure;
main power conductors disposed in the enclosure;
secondary power conductors disposed in the enclosure;
network data conductors disposed in the enclosure; and
a component assembly including a component support and at least one component mounted on the support, the component assembly being engageable in the enclosure;
wherein the component assembly is selectably positionable between an operational position in which the component assembly is electrically connected to the main power conductors and to the secondary power conductors and the network data conductors, and a service position in which the component assembly is electrically disconnected from the main power conductors but remains electrically connected to the secondary power conductors and the network data conductors to receive second power and network data, and a disengaged position wherein the component assembly is disengaged from the main power conductors, the secondary power conductors, and the network data conductors.

30. The system of claim 29, wherein secondary power comprises an ac or dc power.

31. The system of claim 29, wherein a service position comprises a first position in which the component assembly remains at least connected to a first secondary power source.

32. The system of claim 31, wherein a further service position comprises a second position in which the component assembly remains at least connected to a second secondary power source.

33. The system of claim 32, wherein a further service position comprises a third position in which the component assembly remains at least connected to the network data conductors.

34. The system of claim 29, wherein the component assembly, upon placement of the component assembly into the service position from the disengaged position, engages first with a ground conductor.

35. The system of claim 29, wherein the component assembly, upon placement of the component assembly into the service position from the engaged position disengages from the secondary power conductor and the network data conductor prior to disengagement from a ground conductor.

36. A method of placing an electrical component system into a test position comprising the steps of:
   providing main power conductors, secondary power conductors, and network data conductors within an enclosure;
   providing at least one component mounted on a component support of a component assembly engageable with respect to the enclosure; and
   moving the component assembly from an operational position in which the component assembly is electrically connected to the main power conductors and to the secondary power and network conductors to a service position wherein in which the component assembly is electrically disconnected from the main power conductors but remains electrically connected to the secondary power and network data conductors to receive secondary power and network data.

37. The method of claim 36, wherein moving comprises partially extracting the component assembly from the enclosure.

38. The method of claim 36, wherein moving comprises moving a set of main power connectors that are disposed of on the support such that the main power connectors complete electrical connection between the component and the main power conductors from and engaged position to a disengaged position.

39. The method of claim 38, wherein moving comprises moving a connector assembly that is disposed of on the support such that the connector assembly couples the component to the second power and network data conductors, from the engaged to the disengaged position.

40. The method of claim 39, wherein moving comprises moving a sliding contact on the connector assembly that electrically communicates with the connector assembly and the secondary power and network data conductors from and engaged to a disengaged position.

41. The method of claim 36, comprising the step of electrically inserting a capacitor across the secondary power conductors.

42. The method of claim 36, comprising the step of carrying the secondary power and network data conductors on an open rail structure located within the enclosure.

43. The method of claim 42, comprising the step of electrically inserting a capacitor across the secondary power conductors.

44. The method of claim 43, wherein electrically inserting comprises electrically inserting at least one first capacitor across a first set of secondary power conductors and inserting at least one second capacitor across a second set of secondary power conductors.

45. A method of selectively engaging or disengaging an electrical unit, comprising the steps of:
   providing main power conductors, secondary power conductors comprising ac and dc power conductors, and network data conductors disposed within an enclosure;
   providing at least one component on a component support of a component assembly engageable into the enclosure;
   moving the component assembly from a service position in which the component assembly is electrically disconnected from the main power conductors but remains electrically connected to the secondary power conductors and the network data conductors to receive secondary power and network data, to a disengaged position in which the component assembly is disengaged from the main power conductors, the secondary power conductors and the network data conductors.

46. The method of claim 45, wherein moving comprises disengaging the connector assembly from the secondary power conductor and network data conductor prior to disconnection from a ground conductor.

47. The method of claim 45, wherein moving comprises disengaging the connector assembly from the secondary power conductor prior to disconnection from the network data conductor.

48. An electrical component system comprising:
   an enclosure;
   main power conductors disposed in the enclosure to provide main power at a first power level;
   secondary power conductors disposed in the enclosure to provide secondary power at a second power level different from the first power level;
   network data conductors disposed in the enclosure to provide network data; and
   a component assembly including a component support and at least one component mounted on the support, the component assembly being engageable in the enclosure;
   wherein the component assembly is positionable in a first position in which the component assembly is electrically connected to the main power conductors and to the secondary and network data conductors, respectively, and a second position in which the component assembly is electrically disconnected from the main power conductors but remains electrically connected to the secondary power and network data conductors to receive secondary power and network data, wherein the at least one component is at least partially operable via secondary power from the secondary power conductors.

49. The system of claim 48, wherein the first power level is at a higher voltage than the second power level.

50. The system of claim 48, wherein he first power level is an alternating current power and the second power level is a different current power.

* * * * *